United States Patent
Tsai et al.

(10) Patent No.: US 10,047,439 B2
(45) Date of Patent: Aug. 14, 2018

(54) METHOD AND SYSTEM FOR TOOL CONDITION MONITORING BASED ON A SIMULATED INLINE MEASUREMENT

(75) Inventors: Po-Feng Tsai, Taipei (TW); Chia-Tong Ho, Taipei (TW); Sunny Wu, Zhudong Town (TW); Jo Fei Wang, Hsin-Chu (TW); Jong-I Mou, Hsinpu Township, Hsinchu County (TW); Chin-Hsiang Lin, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 715 days.

(21) Appl. No.: 13/314,850

(22) Filed: Dec. 8, 2011

(65) Prior Publication Data

US 2013/0150997 A1 Jun. 13, 2013

(51) Int. Cl.
G06F 19/00 (2018.01)
C23C 16/52 (2006.01)
H01L 21/66 (2006.01)

(52) U.S. Cl.
CPC .............. *C23C 16/52* (2013.01); *H01L 22/20* (2013.01); *H01L 22/12* (2013.01); *H01L 2924/0002* (2013.01)

(58) Field of Classification Search
CPC .... H01L 21/00; H01L 21/02021; G06F 19/00
USPC ........................................................ 700/121
See application file for complete search history.

(56) References Cited

U.S. PATENT DOCUMENTS

| | | | | |
|---|---|---|---|---|
| 7,403,832 | B2 * | 7/2008 | Schulze | G05B 13/048 216/67 |
| 7,797,073 | B1 | 9/2010 | Pasadyn et al. | |
| 2003/0229410 | A1 * | 12/2003 | Smith | G06F 17/5068 700/109 |
| 2004/0267399 | A1 * | 12/2004 | Funk | G05B 19/41875 700/121 |
| 2005/0071037 | A1 * | 3/2005 | Strang | G05B 19/41885 700/121 |
| 2005/0132306 | A1 * | 6/2005 | Smith | G06F 17/5068 716/114 |
| 2006/0075314 | A1 | 4/2006 | Lin et al. | |
| 2006/0276922 | A1 * | 12/2006 | Hsu et al. | 700/110 |
| 2007/0230770 | A1 * | 10/2007 | Kulkarni | G06F 17/5045 382/149 |
| 2009/0036029 | A1 * | 2/2009 | Ortleb | B24B 37/013 451/10 |
| 2009/0240366 | A1 * | 9/2009 | Kaushal | G05B 13/0265 700/110 |
| 2010/0228370 | A1 * | 9/2010 | Tsen | H01L 21/67276 700/103 |
| 2010/0249974 | A1 * | 9/2010 | Fei | G05B 21/02 700/105 |
| 2011/0014577 | A1 * | 1/2011 | Hashimoto | G01N 21/94 430/325 |

(Continued)

*Primary Examiner* — Suresh Suryawanshi
(74) *Attorney, Agent, or Firm* — Haynes and Boone, LLP

(57) ABSTRACT

A method and system for removing control action effects from inline measurement data for tool condition monitoring is disclosed. An exemplary method includes determining a control action effect that contributes to an inline measurement, wherein the inline measurement indicates a wafer characteristic of a wafer processed by a process tool; and evaluating the inline measurement without the control action effect contribution to determine a condition of the process tool.

20 Claims, 4 Drawing Sheets

(56) References Cited

U.S. PATENT DOCUMENTS

2011/0202238 A1\* 8/2011 Cebon et al. ................... 701/41

\* cited by examiner

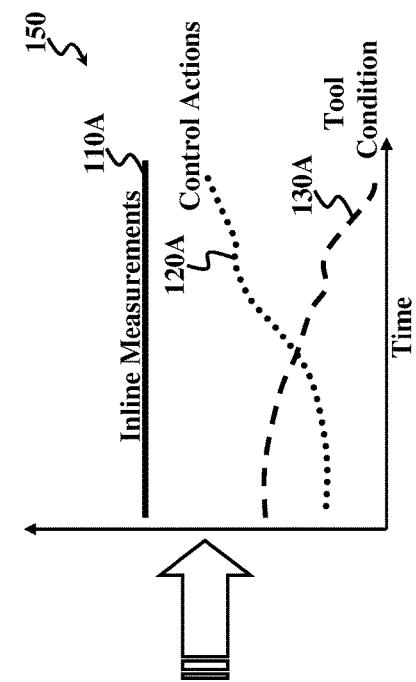
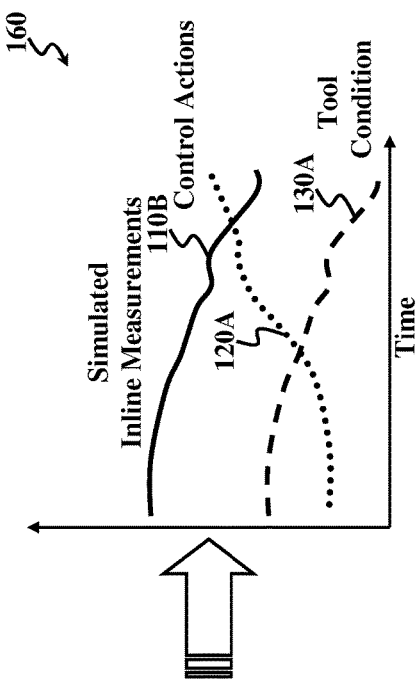
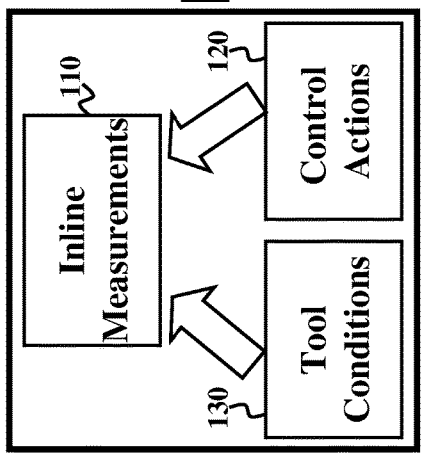
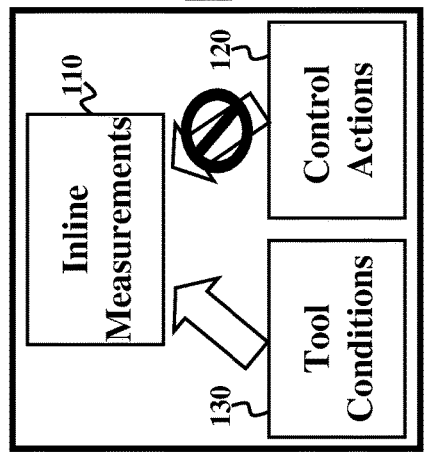
FIG. 2A
FIG. 2B

METHOD AND SYSTEM FOR TOOL CONDITION MONITORING BASED ON A SIMULATED INLINE MEASUREMENT

BACKGROUND

Integrated circuits are fabricated by processing wafers with a series of wafer fabrication tools (referred to as processing tools). Each processing tool typically performs a wafer fabrication task (referred to as a process) on the wafers according to a predefined (or predetermined) process recipe that specifies various parameters of the process. For example, a deposition processing tool, such as a chemical vapor deposition (CVD) processing tool, may form a layer of the wafers within a chamber according to a deposition process recipe that specifies various parameters of the deposition process recipe, such as temperatures and pressures within the chamber as a function of time, as well as the type and flow rate of gas introduced thereto. The specified deposition process recipe may achieve a target thickness of the layer of the wafers. Typically, a fault detection and classification (FDC) system monitors the process parameters, and resulting wafer characteristics, in order to monitor conditions of the process tool. For example, if a process parameter (such as the chamber temperature or chamber pressure in a CVD processing tool) or a wafer characteristic (such as a thickness of a layer formed in the CVD processing tool) deviates from an acceptable range, the FDC system triggers an alarm so that a troubleshooting procedure can be initiated to determine whether such deviation arises from a condition of the process tool. However, it has been observed that the FDC system's monitoring function is often affected by control actions implemented (for example, by an automated process control (APC) system) to ensure that the wafer characteristics meet specified integrated circuit device targets. For example, control actions modify parameters of the predefined process recipe (such as the chamber temperature or chamber pressure of a CVD deposition process recipe) to ensure that the wafer characteristics meet the integrated circuit device targets (such as a thickness of a layer formed by the CVD processing tool). Since the FDC system monitors the process parameters and wafer characteristics that have been tuned via the control actions, a condition of the tool may thus go unnoticed, such that a tool condition may be deteriorating though wafer characteristics are meeting integrated circuit device targets. Accordingly, although existing process tool monitoring methods and systems have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2A and FIG. 2B illustrate various relationships between inline measurements, control actions, and tool conditions during integrated circuit device processing according to various aspects of the present disclosure.

DETAILED DESCRIPTION

Figure 1:
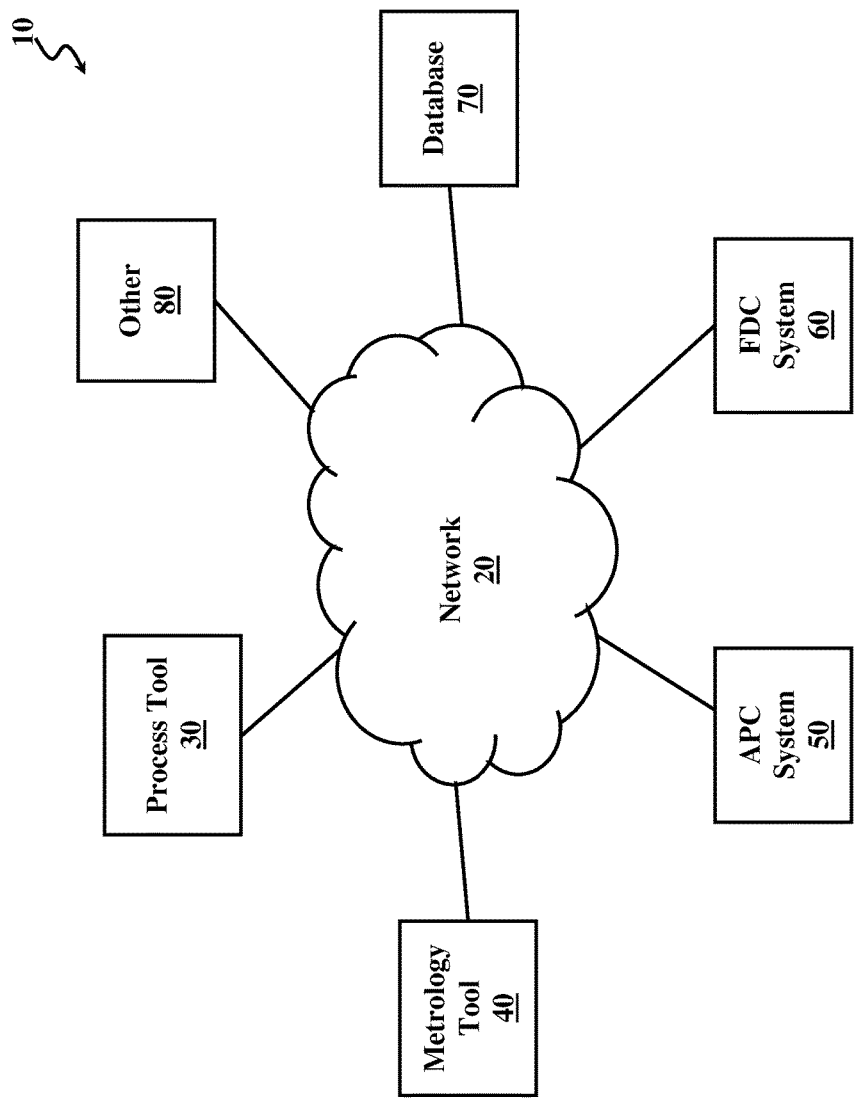
FIG. 1 is a block diagram of an integrated circuit device fabrication system according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a block diagram of an integrated circuit device fabrication system 10 according to various aspects of the present disclosure. The integrated circuit device fabrication system 10 may be a virtual integrated circuit device fabrication system (a "virtual fab"). The integrated circuit device fabrication system 10 fabricates integrated circuit devices. For example, the integrated circuit device fabrication system 10 may implement a semiconductor manufacturing process that fabricates a plurality of substrates (or wafers). A substrate includes a wafer, a semiconductor substrate, a mask (photomask or reticle, collectively referred to as mask), or any base material on which processing is conducted to produce layers of material, pattern features, and/or integrated circuits. The integrated circuit device fabrication system 10 has been simplified for the sake of clarity to better understand the inventive concepts of the present disclosure. Additional features can be added in the integrated circuit device fabrication system 10, and some of the features described below can be replaced or eliminated in other embodiments of the integrated circuit device fabrication system 10.

The integrated circuit device fabrication system 10 includes a network 20 that enables various entities (a process tool 30, a metrology tool 40, an advanced process control (APC) system 50, a fault detection and classification (FDC) system 60, a database 70, and other entity 80) to communicate with one another. The integrated circuit device fabrication system 10 may include more than one of each of the entities in the depicted embodiment, and may further include other entities not illustrated in the depicted embodiment. In the present example, each entity of the integrated circuit device fabrication system 10 interacts with the other entities via the network 20 to provide services to and/or receive services from the other entities. The network 20 may be a single network or a variety of different networks, such as an intranet, an Internet, other network, or combinations thereof. The network 20 includes wired communication channels, wireless communication channels, or combinations thereof.

The process tool 30 performs an integrated circuit device fabrication process. In the depicted embodiment, the process tool 30 is a deposition tool, such as a chemical vapor deposition (CVD) tool. A wafer can be placed into the deposition tool and subjected to a deposition process, such as a CVD process, to form a material layer of the wafer. The deposition process forms the material layer according to a predetermined (or predefined) deposition processing recipe to achieve a desired thickness of the material layer. The deposition processing recipe specifies various deposition process parameters. For example, a CVD deposition processing recipe may specify CVD deposition process parameters, such as deposition time, type of precursor gas, flow rate of precursor gas, chamber temperature, chamber pressure, wafer temperature, other process parameters, or combinations thereof. The process tool 30 includes one or more sensors for monitoring various tool and process conditions. In the present example, the deposition tool includes one or more sensors for monitoring chamber pressure, chamber temperature, wafer temperature, gas flow, deposition time, other tool and process conditions, or combinations thereof.

The metrology tool 40 measures and collects data associated with wafers during integrated circuit device fabrication. For example, the metrology tool 40 performs inline measurements on the processed wafers to obtain information about various wafer characteristics of the wafers, such as a critical dimension of a feature of the wafer (for example, a line width of the feature), a thickness of a material layer of the wafer, an overlay accuracy between layers or features of the wafer, a dopant profile (or concentration) of a feature, a size and/or type of defect, electrical characteristics of a feature, other wafer characteristics, or combinations thereof. In the depicted embodiment, the metrology tool 40 measures wafer characteristics of wafers processed by the process tool 30. For example, the metrology tool 40 measures a thickness of material layers of the wafers formed by the deposition process performed in the process tool 30. The metrology tool 40 may include electrical tools, optical tools, analytical tools, other tools, or combinations thereof to measure and collect such data. Such tools include microscopes (for example, scanning electron microscopes and/or optical microscopes), micro-analytical tools, line width measurement tools, mask and reticle defect tools, particle distribution tools, surface analysis tools, stress analysis tools, resistivity and contact resistance measurement tools, mobility and carrier concentration measurement tools, junction depth measurement tools, film thickness tools, gate oxide integrity test tools, capacitance-voltage measurement tools, focused ion beam (FIB) tools, laser surface defect scanners, residual gas analyzers, process tool particle counters, wafer assessment testing tools, other metrology tools, or combinations thereof.

The APC system 50 monitors wafer characteristics of the processed wafers and uses inline metrology data (for example, such as that collected by the metrology tool 40), process models, and various algorithms to provide dynamic fine-tuning of intermediate process targets to enhance final device targets of the wafers. Fine-tuning such process targets may be referred to as control actions, which compensate for tool issues and/or process issues that may produce wafer characteristic variations. The APC system 50 can implement control actions in real time, wafer-to-wafer, lot-to-lot, or a combination thereof. Real time process control actions enable changes to the process parameters for each wafer while it is being processed based on information from in-situ monitoring. In an example, a wafer may be evaluated after it has undergone one processing step, such that a subsequent processing step on the wafer can be adjusted. Wafer-to-wafer control actions control every wafer within a lot independently, for example, by monitoring a wafer as it exits a processing chamber via inline metrology data and adjusting the process performed in the processing chamber for subsequent wafers based on the inline metrology data. Lot-to-lot control actions enable changes to processing parameters for each wafer lot.

In the depicted embodiment, the APC system 50 implements control actions to modify the deposition processing recipe performed by the process tool 30 to form the material layers of the wafers. For example, as noted above, a predetermined deposition processing recipe specifies a predetermined deposition time to achieve a desired thickness of the material layer (the "process target"), and the APC system 50 (based on inline metrology data of processed wafers, process models, and various algorithms) modifies the predetermined deposition time (for example, increasing or decreasing the deposition time) for each processed wafer to ensure that the material layer of each processed wafer achieves the desired thickness. The APC system 50 thus contributes control action effects to achieve the desired thickness of the material layer for each processed wafer—for example, because the APC system modifies the deposition time (in other words, actual deposition time=predetermined deposition time±time compensation determined by the APC system 50), a thickness of the material layer of each processed wafer is different than it would have been if the predetermined deposition time associated with the predetermined deposition process recipe had been used to form the material layers.

The FDC system 60 evaluates conditions of the process tool 30 to detect tool issues, such as tool condition deterioration, by monitoring the process parameters of the integrated circuit device fabrication process performed by the process tool 30, and wafer characteristics achieved by the integrated circuit device fabrication process performed by the process tool 30. In the depicted embodiment, to detect issues with the deposition process tool 30, the FDC system 60 monitors the deposition process parameters that the process tool 30 uses to form each material layer of the wafers and the thicknesses of the such material layers. The FDC system 60 evaluates these deposition process parameters and wafer characteristics to detect abnormalities, or faults, during operation of the deposition process tool. In an example, an abnormality is indicated when, during a deposition process, a chamber pressure varies (higher or lower) significantly from a chamber pressure specified by the predetermined deposition processing recipe. In another example, an abnormality is indicated when, during a deposition process, a flow rate of a precursor gas varies (higher or lower) significantly from a flow rate of the precursor gas specified by the predetermined deposition processing recipe. In yet another example, an abnormality is indicated when a thickness of a material layer of a wafer formed in the deposition tool varies (higher or lower) significantly from a target thickness. Such abnormalities may indicate issues with the process tool 30. For example, a damaged chamber of the deposition tool (such as a leak) may cause the chamber pressure and/or chamber temperature to vary from the expected chamber pressure and/or chamber temperature, or contamination within the chamber of the deposition tool may negatively affect the wafer characteristics of the processed wafers.

The FDC system 60 often implements statistical process control (SPC) to track and analyze conditions of the process tool 30. For example, the FDC system 60 may implement SPC charts that document historical process performance by charting SPC data associated with the deposition process over time. Such SPC data includes the process parameters and/or the wafer characteristics associated with multiple wafers processed by the process tool 30. When the SPC data indicates that process parameters and/or wafer characteristics have departed from an acceptable range (in other words, when the FDC system 60 detects a fault or abnormality), the FDC system 60 triggers an alarm and may notify an operator of the process tool 30, halt the process performed by the process tool 30, take another action, or a combination thereof, so that any issues with the process tool 30 may be identified and remedied. The SPC data typically includes contributions from (or compensations provided by) the APC system 50, which can hinder ability of the FDC system 60 to detect deteriorating conditions of the process tool 30. For example, even though conditions of the process tool 30 may be deteriorating, the FDC system 60 may not trigger an alarm based on the measured wafer characteristics because the APC system 50 modifies the predetermined deposition processing recipe as each material layer of the wafers is deposited, such that the SPC data will indicate that the measured wafer characteristics varies within an acceptable range (for example, the thickness of each material layer falls within an acceptable range from the target thickness). Further, though the FDC system 60 also monitors the process parameters of the deposition process, the modifications to such process parameters by the APC system 50 often remain within an acceptable range, such that conditions of the process tool 30 may reach an unacceptable level of deterioration before the FDC system 60 triggers an alarm. Accordingly, conditions of the process tool 30 may be deteriorating and going undetected by the FDC system 60.

The database 70 stores data associated with the integrated circuit device fabrication system 10, and particularly data associated with the integrated circuit device fabrication processes. In the depicted embodiment, the database 70 stores data collected from the process tool 30, the metrology tool 40, the APC system 50, the FDC system 60, and the other entity 80. In an example, the metrology tool 40, the APC system 50, the FDC system 60, and the other entity 80 each have an associated database. Optimizations and other adjustments may be made to the process tool 30 via the network 20 based on the data stored in the database 70.

FIG. 2A and FIG. 2B illustrate various relationships between inline measurements (block 110), control actions (block 120), and tool conditions (block 130) during integrated circuit device processing according to various aspects of the present disclosure. Referring to FIG. 2A, inline metrology data, which is acquired during wafer processing, typically includes inline measurements (block 110) that indicate characteristics of a processed wafer, such as a critical dimension of a feature of the wafer (for example, a line width of the feature), a thickness of a material layer of the wafer, an overlay accuracy between layers or features of the wafer, a dopant profile (or concentration) of a feature, a size and/or type of defect, electrical characteristics of a feature, other wafer characteristics, or combinations thereof. Each inline measurement (measured wafer characteristic) is associated with a processing recipe (that includes various process parameters). For example, a deposition process (such as a chemical vapor deposition process) is performed according to a deposition process recipe (that includes various deposition process parameters) to form a material layer of a wafer, and the inline measurement indicates a thickness of the material layer (the measured wafer characteristic) achieved by the deposition process according to the deposition process recipe. Ideally, the measured thickness is substantially equal to a target thickness, which is a thickness expected if the deposition process is performed according to the deposition process recipe.

Control actions (block 120) and tool conditions (block 130) contribute to the inline measurements (block 110). The control actions (block 120) fine tune processing of the wafers by implementing feed forward and feedback mechanisms to automatically determine optimal processing recipes for each wafer. For example, the deposition process recipe (particularly the various deposition process parameters) may have been modified or fine tuned via control actions to achieve the measured thickness of the material layer. In an example, the deposition time is modified according to the control actions to achieve the measured thickness of the material layer. The control actions (block 120) often compensate for the tool conditions (block 130). For example, in FIG. 2A, a graph 150 includes a curve 110A, a curve 120A, and a curve 130A that respectively illustrate how inline measurements, control actions, and tool conditions may vary over time. The curve 110A indicates that the inline measurements are substantially constant over time, the curve 120A indicates that the control actions increase over time, and the curve 130A indicates that the tool conditions decreases over time. For example, where the inline measurements (block 110) are a thickness of a material layer of processed wafers over time, the control actions (block 120) are modifications of the deposition time, and the tool conditions (block 130) are indicative of the conditions of a deposition process tool that performs the deposition process, the graph 150 indicates that the inline measurements consistently meet wafer/device targets over time (in other words, the thickness of the material layer of each of the processed wafers consistently meets the target thickness), the control actions increase over time (in other words, control action modifications of the deposition time or deposition process recipe increase with subsequently processed wafers), and the tool conditions deteriorate over time (in other words, a condition of the deposition process tool is deteriorating and such deterioration is affecting the deposition process). Because the control actions (block 120) essentially compensate for the deteriorating tool condition, tool conditions (block 130) may degrade while the inline measurements (block 110) meet target (or expected) wafer/device characteristics. Accordingly, if the inline measurements are evaluated, it appears that the deposition process tool and associated system for performing the deposition process are working properly when, in fact, the deposition process tool has an issue that requires fixing because it is negatively affecting processing (for example, requiring increased use of control actions).

Such relationships may arise in the integrated circuit device fabrication system 10 of FIG. 1. For example, the metrology tool 40 is associated with the inline measurements (in other words, the metrology tool collects the inline measurements), the APC system 50 is associated with the control actions (in other words, the APC system 50 implements the control actions), and the tool conditions are associated with the process tool 30. A condition of the process tool 30 may deteriorate to an extent that causes actual deposition process parameters to vary from the specified deposition process parameters, leading to the wafer characteristics varying from the specified target wafer characteristics. However, because the APC system 50 implements control actions to ensure that the wafer characteristics are meeting the specified targets, the APC system 50 may modify the deposition process parameters to compensate for the deteriorating tool condition. Since the FDC system 60 monitors the deposition process parameters (which have been modified by the APC system 60) and the wafer characteristics (which meet specified targets because of compensations implemented by the APC system 60), the FDC system 60 may inadequately monitor conditions of the process tool 30.

Referring to FIG. 2B, the tool conditions (block 130) are evaluated by removing the control actions (block 120) that contribute to the inline measurements (block 110), such that the tool conditions can be evaluated using the inline measurements. For example, FIG. 2B includes a graph 160 that includes a curve 110B, the curve 120A, and the curve 130A that respectively illustrate how simulated inline measurements, control actions, and tool conditions may vary over time. The curve 110B indicates simulated inline measurements, which are inline measurements that would be observed if control actions had not been implemented to achieve the wafer characteristic. By removing contribution of the control actions (block 120) to the inline measurements (block 110), the inline measurements track the tool's performance, and thus indicate that the tool is exhibiting deteriorating tool conditions. Tool issues can thus be detected, identified, and remedied earlier by removing the control actions' contribution and evaluating the simulated inline measurements. In the present example, where the inline measurements (block 110) are a thickness of a material layer of processed wafers over time, and the control actions (block 120) are modifications of the deposition time, removing the control actions involves determining a thickness of the material layer that would have been achieved by the predetermined deposition process recipe. More specifically, removing the control actions involves determining a thickness of the material layer that would have been achieved without modifying the deposition time.

Figure 3:
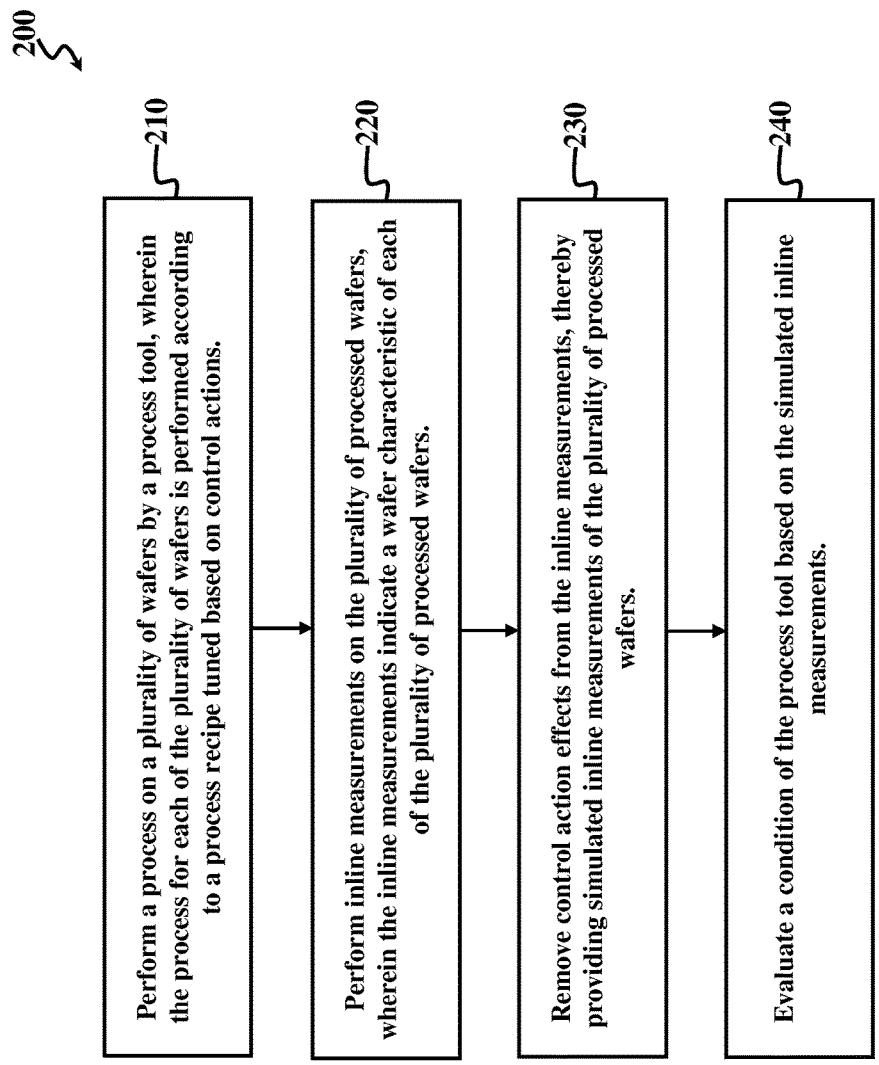
FIG. 3 is a flow chart of a method for evaluating a condition of a process tool according to various aspects of the present disclosure.

FIG. 3 is a flow chart of a method 200 for evaluating a condition of a process tool according to various aspects of the present disclosure. In an example, the method 200 may be used to evaluate performance (or condition) of the process tool 30 in integrated circuit device fabrication system 10 of FIG. 1. The method 200 begins at block 210 where a process is performed on a plurality of wafers by a process tool. The process for each of the plurality of wafers is performed according to a process recipe tuned based on control actions. For example, the process tool 30 performs a deposition process, such as a CVD deposition process, to form a material layer of a plurality of wafers. A deposition process recipe for forming the material layer of each of the plurality of wafers is tuned based on control actions (for example, determined by the APC system 50). In a specific example, a deposition time for forming the material layer of each of the plurality of wafers is tuned based on the control actions (in other words, the deposition time remains the same as a predetermined deposition time, or the deposition time is increased or decreased from the predetermined deposition time). At block 220, inline measurements are performed on the plurality of processed wafers. The inline measurements indicate a wafer characteristic of each of the plurality of processed wafers. For example, the metrology tool 40 performs inline measurements on the plurality of wafers processed by the process tool 30. The inline measurements indicate a thickness of the material layer of each of the plurality of wafers.

At block 230, control action effects are removed from the inline measurements, thereby providing simulated inline measurements of the plurality of processed wafers. The simulated inline measurements indicate a wafer characteristic for each of the plurality of wafers that would have been achieved by the process tool if the process recipe had not been tuned based on the control actions. For example, considering a material layer of one of the processed wafers, where the inline measurement indicates a thickness of the material layer, the control action effects represent an increase or decrease in the thickness of the material layer achieved by the tuned deposition time. Such increase or decrease in thickness is removed from the inline thickness to provide a simulated inline thickness, more specifically, a thickness of the material layer of the wafer that would have been achieved without the APC system 50 tuning the deposition time. In the integrated circuit device fabrication system 10, removing the control action effects may be implemented by the other entity 80, the FDC system 60, the APC system 50, other entity, or combination thereof. At block 240, a condition of the process tool is then evaluated based on the simulated inline measurements. For example, a condition of the process tool 30 is evaluated based on the simulated inline thicknesses of the material layer of each of the plurality of wafers. Additional steps can be provided before, during, and after the method 200, and some of the steps described can be replaced or eliminated for other embodiments of the method 200.

Figure 4:
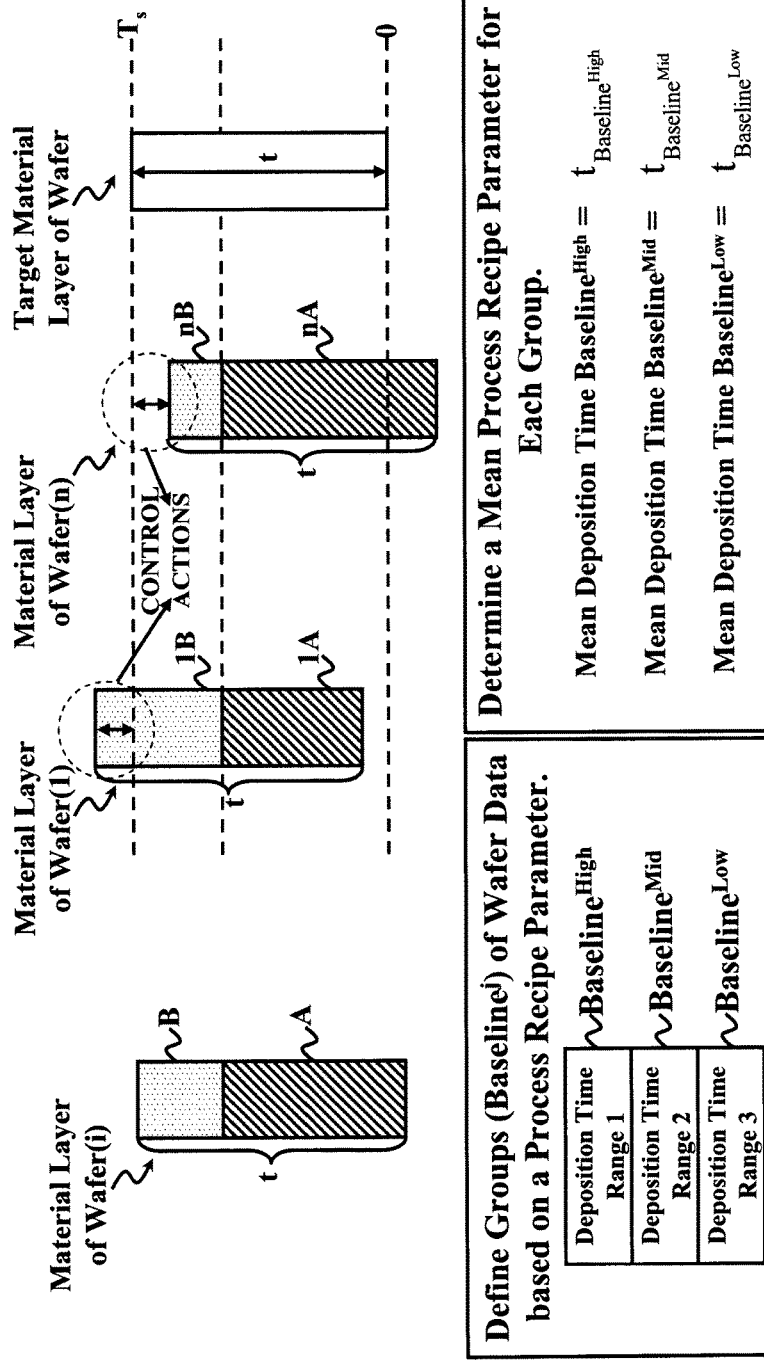
FIG. 4 schematically illustrates a method of removing control action effects from inline measurements that can be implemented in the method of FIG. 3 according to various aspects of the present disclosure.

FIG. 4 schematically illustrates a method of removing control action effects from inline measurements that can be implemented in the method 200 of FIG. 3, particularly at block 230 of the method 200, according to various aspects of the present disclosure. The present example applies to a process tool (such as the process tool 30) that performs a deposition process to form a material layer of a wafer. The deposition process has a predetermined deposition process recipe that specifies a predetermined deposition time ($T_s$) for achieving a target (or baseline) thickness (t) of the material layer of the wafer. In other words, ideally, if the material layer of the wafer is formed by the deposition process according to the predetermined deposition process recipe, performing the deposition process for the predetermined deposition time ($T_s$) forms the material layer having the target thickness (t). However, as discussed above, tool issues, process issues, or a combination thereof may produce wafer characteristic variations, such that the thickness of the material layer of the wafer varies from the target thickness even though the deposition process uses the predetermined deposition process recipe (such as the predetermined deposition time ($T_s$) to form the material layer. Control actions are thus implemented (for example, by the APC system 50) to tune the deposition process recipe to form the material layer, such that, during processing, the deposition process recipe used to form the material layer may vary from the predetermined deposition process recipe to ensure that the material layer meets the target thickness. For example, the deposition process recipe used to form the material layer may use a deposition time that is greater than or less than predetermined deposition time ($T_s$). Such modification or change to the predetermined deposition time, specifically, the change in deposition time ($\Delta t$), is referred to as the control actions (or control action compensation).

Expanding on the present example, the process tool 30 performs a deposition process to form a material layer of wafer(i) where i=1, 2, 3, . . . n (n being a number of wafers processed by the process tool 30). Inline measurements of the material layer of wafer(i) are performed, for example, by the metrology tool 40, to determine a thickness of the material layer of wafer(i). In the present example, the material layer of wafer(i) has the target thickness (t). The deposition process recipe for forming the material layer of the wafer(i) is tuned based on control actions, implemented by the APC system 50, to ensure that the material layer of wafer(i) exhibits the target thickness (t). Accordingly, the deposition process recipe used to form the material layer of wafer(i) may vary from the predetermined deposition process recipe, and the inline thickness of the material layer of wafer(i) has a portion A and a portion B. The portion A represents a proportion (or percentage) of the thickness of the material layer of wafer(i) that would have been achieved by the deposition process according to the predetermined deposition process recipe, and the portion B represents a proportion (or percentage) of the thickness of the material layer of wafer(i) achieved by control action compensations (in other words, modifications to the predetermined deposition process recipe). More specifically, the portion B may indicate how significantly the predetermined deposition process recipe, such as the predetermine deposition time, was modified to achieve the target thickness (t).

Here, a material layer of wafer(1) through a material layer of wafer(n) substantially exhibits the target thickness (t) by performing the deposition process according to a processing recipe tuned based on the control actions. During processing, the predetermined processing recipe was modified by the APC system 50 to ensure that the thickness of both the material layer of wafer(1) and the material layer of wafer(n) substantially exhibit the target thickness (t)—the predetermined deposition time (Ts) was increased for forming the material layer of wafer(1) and decreased for forming the material layer of wafer(n). Accordingly, the inline thickness of the material layer of wafer(1) has a portion 1A and a portion 1B, and the inline thickness of the material layer of wafer(n) has a portion nA and a portion nB. Comparing the portions 1A/1B of the material layer of wafer(1) and the portions nA/nB of the material layer of wafer(n), it appears that greater control actions (in other words, modifications to the predetermined deposition process recipe) were implemented to ensure that the material layer of wafer(1) met the target thickness than the material layer of wafer(n).

More specifically, assuming the predetermined deposition processing time ($T_s$) of the predetermined deposition processing recipe is about 60 seconds and a deposition rate of the predetermined processing recipe is about 2 Å/second, a deposition time for forming the material layer of wafer(1) was increased to achieve the target thickness (t), and a deposition time for forming the material layer of wafer(n) was decreased for forming the material layer of wafer(n) to achieve the target thickness (t). The control action compensation in the present example is thus a change in deposition time ($\Delta t$), represented by the following equation (1):

$$\Delta t = T_{actual} - T_s \quad (1)$$

where $T_{actual}$ is the actual deposition time used to form the material layer of wafer(i). In a specific example, assume that the deposition time for forming the material layer of wafer (1) was about 63 seconds, and the deposition time for forming the material layer of wafer(n) was about 59 seconds. The control action compensation for wafer(1) increased the deposition time about 3 seconds ($\Delta t = T_{actual} - T_s = 63$ seconds−60 seconds=3 seconds), and the control action compensation for wafer(n) decreased the deposition time about 1 second ($\Delta t = T_{actual} - T_s = 59$ seconds−60 seconds=−1 second). It is noted that, considering the material layers of wafer(1) and wafer(n) individually, if the deposition time was not modified via the control actions (in other words, no change in deposition time ($\Delta t$)), the thickness of the material layer of wafer(1) would have been about 6 Å less than the target thickness ($\Delta t$*deposition rate=3 seconds*2 Å/second=6 Å), and the thickness of the material layer of wafer(n) would have been about 2 Å more than the target thickness ($\Delta t$*deposition rate=1 second*2 Å/second=2 Å).

The control actions (here, a change in deposition time ($\Delta t$)) thus affect the thickness of the material layers, where a change in the thicknesses of the material layers ($\Delta Y$) achieved with the control action compensation may be referred to as control action effects. By removing the control action effects—an increase or decrease in thickness of the material layer achieved by the control actions ($\Delta Y$)—the thicknesses of the material layers that would have been achieved without the control actions may be evaluated. The following describes removing the control action compensation from the inline measurements (here, the thickness measurements) for the material layers of wafer(1) through wafer(n), such that the inline measurements (the thickness) that would have been achieved without the control actions can be determined for the material layers of wafer(1) through wafer(n). Specifically, as further described below, a mean-based adjustment is made to the measured thicknesses of the material layers of wafer(1) through wafer(n) to simulate the thicknesses of the material layers of wafer(1) through wafer(n) that would have been achieved without the control actions.

In the present example, group(j) (Baseline$^j$, where j=1, . . . , N (N being a number of groups)) of wafer data is defined based on a process recipe parameter. For example, groups (Baseline$^j$, where j=1, . . . , N) of wafer data are defined based on a deposition time of the deposition process recipe used to form the material layers of wafer(1) through wafer(n). Any number of groups may be defined, including only one group, depending on the wafer data being observed. Here, three groups are defined (N=3 and j=1, 2, and 3): Baseline$^1$=Baseline$^{High}$, where Baseline$^{High}$ includes wafer data associated with a deposition time range 1; Baseline$^2$=Baseline$^{Mid}$, where Baseline$^{Mid}$ includes wafer data associated with a deposition time range 2; and Baseline$^3$=Baseline$^{Low}$, where Baseline$^{Low}$ includes wafer data associated with a deposition time range 3. For example, Baseline$^{High}$ may include wafer data associated with the material layers of wafer (1) through wafer(n) where the deposition time was about 66 seconds to about 70 seconds (in other words, the control action compensation, $\Delta t$, was about +6 seconds to about +10 seconds greater than the predetermined deposition time); Baseline$^{Mid}$ may include wafer data associated with the material layers of wafer(1) through wafer(n) where the deposition time was about 59 seconds to about 66 seconds (in other words, the control action compensation, $\Delta t$, was about −1 second less than the predetermined deposition time to about +6 seconds greater than the predetermined deposition time); and Baseline$^{Low}$ may include wafer data associated with the material layers of wafer(1) through wafer(n) where the deposition time was about 50 seconds to about 59 seconds (in other words, the control action compensation, $\Delta t$, was about −10 seconds to about −1 second less than the predetermined deposition time). Wafer data associated with both wafer(1) (where the deposition time for forming the material layer of wafer(1) was about 63 seconds) and wafer(n) (where the deposition time for forming the material layer of wafer(n) was about 59 seconds) is thus grouped in the Baseline$^{Mid}$ group. The deposition time ranges are merely examples, and any deposition time range is contemplated by the present disclosure.

The wafer data associated with each group is then evaluated to determine a process recipe parameter associated with (or representative of) each group. In the present example, a mean process recipe parameter, such as a mean (average) deposition time, is determined for each group. A mean deposition time ($t_{BaselineHigh}$) for the Baseline$^{High}$ group is determined based on the deposition times of the material layers of wafer(1) through wafer(n) that belong to the Baseline$^{High}$ group; a mean deposition time ($t_{BaselineMid}$) for the Baseline$^{Mid}$ group is determined based on the deposition times of the material layers of wafer(1) through wafer(n) that belong to the Baseline$^{Mid}$ group; and a mean deposition time ($t_{BaselineLow}$) for the Baseline$^{Low}$ group is determined based on the deposition times of the material layers of wafer(1) through wafer(n) that belong to the Baseline$^{Low}$ group. For the sake of example, assuming that the deposition times for forming the material layers of wafer(1) and wafer(n) are the only deposition times that fall within the Baseline group, the mean deposition time ($t_{BaselineLow}$) for the Baseline$^{Low}$ group is about 61 seconds ($t_{BaselineLow}$=(63 seconds+ 59 seconds)/2=61 seconds). Alternatively, other methods may be used to determine the representative process recipe parameters for each group, such as a median deposition time of each group.

Then, a simulated inline measurement is determined for the material layers of wafer(1) through wafer(n), where the simulated inline measurement indicates the wafer characteristic without the control action effects (or the wafer characteristic that would have been achieved without implementing control actions). In the present example, a simulated thickness of the material layers of wafer(1) through wafer(n) is determined by removing the control action effects. The following Equation (2) provides an algorithm for determining such simulated thickness:

$$Y_{i,j}^{deCA} = Y_{i,j}^{actual} + [(t_j - t_{i,j}^{actual}) * \text{DepRate}] \quad (2)$$

where $Y_{i,j}^{deCA}$ is the simulated inline thickness of the material layer of wafer(i) belonging to group(j) (in other words, the thickness of the material layer that would have been observed without the control actions (here, without modifying the predetermined deposition time)); $Y_{i,j}^{actual}$ is the measured inline thickness of the material layer of wafer(i) belonging to group(j); $t_j$ is the deposition time associated with or representative of the group(j) (in other words, the mean deposition time associated with group(j)); $t_{i,j}^{actual}$ is the actual deposition time used to form the material layer of wafer(i) belonging to group(j) (in other words, the deposition time determined after applying the control actions); and DepRate is the deposition rate of the predetermined deposition process recipe. For example, returning to the example material layers of wafer(1) and wafer(n), the simulated inline thicknesses for the material layers of wafer(1) and wafer(n) may be respectively determined by the following:

$$Y_{1,Baseline^{Mid}}^{deCA} = Y_{1,Baseline^{Mid}}^{actual} + [t_{Baseline^{Mid}} - t_{1,Baseline^{Mid}}^{actual}] * \text{DepRate} \quad (3)$$

$$Y_{n,Baseline^{Mid}}^{deCA} = Y_{n,Baseline^{Mid}}^{actual} + [t_{Baseline^{Mid}} - t_{n,Baseline^{Mid}}^{actual}] * \text{DepRate} \quad (4)$$

In the present example, the mean deposition time for the Baseline$^{Mid}$ group is about 61 seconds $t_{Baseline^{Mid}}$=61 seconds); the measured thicknesses of the material layers of wafer(1) and wafer(n) meet the target thickness of about 120 Å ($Y_{1,Baseline^{Mid}}^{actual} = Y_{n,Baseline^{Mid}}^{actual}$=120 Å); the actual deposition time for forming the material layer of wafer(1) is about 63 seconds ($t_{1,Baseline^{Mid}}^{actual}$=63 seconds); the actual deposition time for forming the material layer of wafer(n) is about 59 seconds ($t_{n,Baseline^{Mid}}^{actual}$=59 seconds); and the deposition rate is about 2 Å/second (DepRate=2 Å/second). The simulated inline thicknesses for wafer(1) is thus about 116 Å ($Y_{1,Baseline^{Mid}}^{deCA}$=120 Å+[(61 seconds− 63 seconds)*2 Å/second]=120 Å+[(−2 seconds)*2 Å/second]=120 Å+(−4 Å)=116 Å); and the simulated inline thickness for wafer(n) is thus about 124 Å ($Y_{n,Baseline^{Mid}}^{deCA}$=120 Å+[(61 seconds−59 seconds)*2 Å/second]=120 Å+[2 seconds*2 Å/second]=120 Å+4 Å=124 Å). Accordingly, the control actions implemented during wafer processing increased the thickness of the material layer of wafer(1) about 4 Å and decreased the thickness of the material layer of the material layer of wafer(n) about 4 Å. Such increase and decrease in thickness may be referred to as the control action effects that contributed to the inline measurements. The simulated inline thicknesses for each material layer of wafer(1) through wafer(n) can be determined accordingly, and then be evaluated to monitor a condition of the process tool 30.

The methods and systems described herein can take the form of an entirely hardware embodiment, an entirely software embodiment, or an embodiment containing both hardware and software elements. Further, the methods and system described herein, or certain aspects or portions thereof, may take the form of program code (instructions) embodied in tangible media, such as floppy diskettes, CD-ROMS, hard drives, or any other machine-readable storage medium, wherein, when the program code is loaded into and executed by a machine, such as a computer, the machine becomes an apparatus for practicing the present disclosure. The methods and apparatus of the present invention may also be embodied in the form of program code transmitted over some transmission medium, such as electrical wiring or cabling, through fiber optics, or via any other form of transmission, wherein, when the program code is received and loaded into and executed by a machine, such as a computer, the machine becomes an apparatus for practicing the present disclosure. When implemented on a general-purpose processor, the program code combines with the processor to provide a unique apparatus that operates analogously to specific logic circuits.

The present disclosure provides for many different embodiments. An exemplary method includes determining a control action effect contribution to an inline measurement, wherein the inline measurement indicates a wafer characteristic of a wafer processed by a process tool; and evaluating the inline measurement without the control action effect contribution to determine a condition of the process tool. In an example, the wafer characteristic of the wafer processed by the process tool is achieved by the process tool performing a process recipe having a process recipe parameter different than a predefined process recipe parameter; and the determining the control action effect contribution to the inline measurement includes determining how the process recipe parameter different than the predefined process recipe parameter affects the wafer characteristic. The method may further include determining a process recipe that includes a process recipe parameter; and implementing a control action to tune the process recipe parameter, wherein the wafer characteristic of the wafer processed by the process tool is achieved by the process tool performing the process recipe with the tuned process recipe parameter. Determining the control action effect contribution to the inline measurement may include determining how a difference in the process recipe parameter and the tuned process recipe parameter affects the wafer characteristic. In an example, the process tool is a deposition tool; the process recipe parameter is a deposition time; the wafer characteristic is a thickness of a material layer of the wafer; and the inline measurement without the control action effect contribution is a thickness of the material layer achieved without implementing the control action to tune the deposition time.

Another exemplary method includes performing a process on a plurality of wafers by a process tool, wherein the process for each of the plurality of wafers is performed according to a process recipe tuned based on control actions; performing inline measurements on the plurality of processed wafers, wherein the inline measurements indicate a wafer characteristic of each of the plurality of processed wafers; removing control action effects from the inline measurements, thereby providing simulated inline measurements of the plurality of processed wafers; and evaluating a condition of the process tool based on the simulated inline measurements. Removing the control action effects from the inline measurements, thereby providing simulated inline measurements of the plurality of processed wafers, may include performing a mean-based adjustment to the inline measurements.

The processing recipe tuned based on control actions may include a tuned process recipe parameter. In an example, the method may further include determining the control action effects by evaluating how the tuned process recipe parameter affects the wafer characteristic. In an example, removing the control action effects from the inline measurements, thereby providing simulated inline measurements of the plurality of processed wafers, may include grouping the plurality of wafers based on the tuned process recipe parameter associated with each of the plurality of wafers; and determining a representative process recipe parameter for the grouped plurality of wafers. Grouping the plurality of wafers based on the tuned process recipe parameter associated with each of the plurality of wafers may include defining a first tuned process recipe parameter range and a second tuned process recipe parameter range, and grouping each of the plurality of wafers in a first group or a second group, wherein a wafer is included in the first group if its tuned process recipe parameter is within the first tuned process recipe parameter range and the wafer is included in the second group if its tuned process recipe parameter is within the second tuned process recipe parameter range. Determining the representative process recipe parameter for the grouped plurality of wafers may include determining a first mean process recipe parameter based on tuned process recipe parameters associated with each of the plurality of wafers grouped in the first group, and determining a second mean process recipe parameter based on tuned process recipe parameters associated with each of the plurality of wafers grouped in the second group. Removing the control action effects from the inline measurements, thereby providing simulated inline measurements of the plurality of processed wafers, may further include using the first mean process recipe parameter to adjust the inline measurements of each of the plurality of wafers grouped in the first group; and using the second mean process recipe parameter to adjust the inline measurements of each of the plurality of wafers grouped in the second group.

In an example, performing the process on the plurality of wafers by a process tool, wherein the process for each of the plurality of wafers is performed according to a process recipe tuned based on control actions may include performing a deposition process on a plurality of wafers by a deposition process tool, wherein the deposition process for each of the plurality of wafers is performed according to a deposition process recipe having a tuned deposition process time, thereby forming a material layer of each of the plurality of wafers; and performing inline measurements on the plurality of processed wafers may include determining a thickness of the material layer of each of the plurality of wafers, the thickness being the wafer characteristic. Removing the control action effects from the inline measurements, thereby providing simulated inline measurements of the plurality of processed wafers, may include determining a mean deposition process time based on tuned deposition process times associated with the plurality of processed wafers; and for each of the plurality of processed wafers, determining a simulated inline thickness based on the mean deposition process time, tuned deposition process time associated with processed wafer, and thickness associated with the processed wafer. In another example, the inline measurement is a thickness of a material layer of a wafer; and removing control action effects from the inline measurements includes determining a thickness of the material layer achieved without tuning the process recipe based on control actions. Determining the thickness of the material layer achieved without tuning the process recipe based on control actions may include determining a thickness of the material layer achieved without increasing or decreasing a deposition time of the process recipe.

An exemplary apparatus includes a computer readable medium that stores a plurality of instructions for execution by at least one computer processor, wherein the instructions are for: determining a control action effect contribution to an inline measurement, wherein the inline measurement indicates a wafer characteristic of a wafer processed by a process tool; and evaluating the inline measurement without the control action effect contribution to determine a condition of the process tool. The apparatus may include a metrology tool that determines the inline measurement; an automated process control system that implements a control action to tune a process recipe parameter of a process recipe, wherein the wafer characteristic of the wafer processed by the process tool is achieved by the process tool performing the process recipe with the tuned process recipe parameter; and a fault detection and classification system that evaluates the inline measurement without the control action effect contribution to determine the condition of the process tool.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
 performing a device fabrication process to a wafer by a process tool;
 determining a control action effect contribution to an actual inline measurement of the wafer, wherein the actual inline measurement indicates a wafer characteristic of the wafer processed by the process tool, and wherein the control action effect contribution results at least in part from actions performed by a process control system to compensate for deteriorating conditions of the process tool;
 generating simulated inline measurement by removing the control action effect contribution from the actual inline measurement; and
 evaluating the simulated inline measurement to determine a true condition of the process tool by eliminating all actions performed by the process control system to compensate for the deteriorating conditions of the process tool;

wherein the determining, the generating, and the evaluating are performed before conditions of the process tool reach a predetermined level of deterioration.

2. The method of claim 1 wherein:

the wafer characteristic of the wafer processed by the process tool is achieved by the process tool performing a process recipe having a process recipe parameter different than a predefined process recipe parameter; and the determining the control action effect contribution to the actual inline measurement includes determining how the process recipe parameter different than the predefined process recipe parameter affects the wafer characteristic.

3. The method of claim 1 further including:

determining a process recipe that includes a process recipe parameter; and implementing a control action to tune the process recipe parameter, wherein the wafer characteristic of the wafer processed by the process tool is achieved by the process tool performing the process recipe with the tuned process recipe parameter.

4. The method of claim 3 wherein the determining the control action effect contribution to the actual inline measurement includes determining how a difference in the process recipe parameter and the tuned process recipe parameter affects the wafer characteristic.

5. The method of claim 3 wherein:

the process tool is a deposition tool;

the process recipe parameter is a deposition time;

the wafer characteristic is a thickness of a material layer of the wafer; and the simulated inline measurement is a thickness of the material layer achieved without implementing the control action to tune the deposition time.

6. A method comprising:

performing a device fabrication process on a plurality of wafers by a process tool, wherein the device fabrication process for each of the plurality of wafers is performed according to a process recipe tuned based on control actions, wherein the control actions include actions performed by a process control system to compensate for deteriorating conditions of the process tool;

performing inline measurements on the plurality of processed wafers, wherein the inline measurements indicate a wafer characteristic of each of the plurality of processed wafers, and wherein a component of the inline measurements include effects resulting from the control actions;

removing the effects of the control actions from the inline measurements, thereby providing simulated inline measurements of the plurality of processed wafers, wherein the simulated inline measurements are provided as a function of time; and evaluating a condition of the process tool based on the simulated inline measurements, wherein the condition of the process tool reflects the condition of the process tool when no actions are performed by the process control system to compensate for the deteriorating conditions of the process tool;

wherein the performing of the process, the performing of the inline measurements, the removing, and the evaluating are performed before conditions of the process tool reach a predetermined level of deterioration.

7. The method of claim 6 wherein the removing the effects of the control actions includes performing a mean-based adjustment to the inline measurements.

8. The method of claim 6 wherein the process recipe tuned based on control actions includes a tuned process recipe parameter.

9. The method of claim 8 further including determining the effects of the control actions by evaluating how the tuned process recipe parameter affects the wafer characteristic.

10. The method of claim 8 wherein the removing the effects of the control actions includes:

grouping the plurality of wafers based on the tuned process recipe parameter associated with each of the plurality of wafers; and determining a representative process recipe parameter for the grouped plurality of wafers.

11. The method of claim 10 wherein:

the grouping the plurality of wafers based on the tuned process recipe parameter associated with each of the plurality of wafers includes:

defining a first tuned process recipe parameter range and a second tuned process recipe parameter range, and grouping each of the plurality of wafers in a first group or a second group, wherein a wafer is included in the first group if its tuned process recipe parameter is within the first tuned process recipe parameter range and the wafer is included in the second group if its tuned process recipe parameter is within the second tuned process recipe parameter range; and determining the representative process recipe parameter for the grouped plurality of wafers includes:

determining a first mean process recipe parameter based on tuned process recipe parameters associated with each of the plurality of wafers grouped in the first group, and determining a second mean process recipe parameter based on tuned process recipe parameters associated with each of the plurality of wafers grouped in the second group.

12. The method of claim 11 wherein the removing the effects of the control actions further includes:

using the first mean process recipe parameter to adjust the inline measurements of each of the plurality of wafers grouped in the first group; and using the second mean process recipe parameter to adjust the inline measurements of each of the plurality of wafers grouped in the second group.

13. The method of claim 6 wherein:

the performing the device fabrication process on the plurality of wafers by a process tool, wherein the device fabrication process for each of the plurality of wafers is performed according to a process recipe tuned based on control actions includes performing a deposition process on a plurality of wafers by a deposition process tool, wherein the deposition process for each of the plurality of wafers is performed according to a deposition process recipe having a tuned deposition process time, thereby forming a material layer of each of the plurality of wafers; and the performing the inline measurements on the plurality of processed wafers includes determining a thickness of the material layer of each of the plurality of wafers, the thickness being the wafer characteristic.

14. The method of claim 13 wherein the removing the effects of the control actions includes:

determining a mean deposition process time based on tuned deposition process times associated with the plurality of processed wafers; and for each of the plurality of processed wafers, determining a simulated inline thickness based on the mean deposition process time, tuned deposition process time associated with processed wafer, and thickness associated with the processed wafer.

15. The method of claim 6 wherein:

the inline measurement is a thickness of a material layer of a wafer; and the removing the effects of the control actions includes determining a thickness of the material layer achieved without tuning the process recipe based on control actions.

16. The method of claim 15 wherein the determining the thickness of the material layer achieved without tuning the process recipe based on control actions includes determining a thickness of the material layer achieved without increasing or decreasing a deposition time of the process recipe.

17. A system, comprising:

a process tool configured to perform a semiconductor fabrication process to a wafer; and a non-transitory computer readable medium that stores a plurality of instructions for execution by at least one computer processor, wherein the instructions are for:

determining a control action effect contribution to actual inline measurements of the wafer, wherein the actual inline measurements indicate a wafer characteristic of the wafer processed by the process tool, and wherein the control action effect contribution results at least in part from actions performed by a process control system to compensate for deteriorating conditions of the process tool;

generating simulated inline measurements as a function of time by removing the control action effect contribution from the actual inline measurements; and evaluating the simulated inline measurements to determine a true condition of the process tool by eliminating all actions performed by the process control system to compensate for the deteriorating conditions of the process tool;

wherein the determining, the generating, and the evaluating are performed before the process tool reaches an unacceptable level of deterioration.

18. The system of claim 17 further including a metrology tool that determines the actual inline measurements.

19. The system of claim 17 further including an automated process control system that implements a control action to tune a process recipe parameter of a process recipe, wherein the wafer characteristic of the wafer processed by the process tool is achieved by the process tool performing the process recipe with the tuned process recipe parameter.

20. The system of claim 17 further including a fault detection and classification system that evaluates the simulated inline measurements to determine the condition of the process tool.

* * * * *